(12) United States Patent
Hayhow et al.

(10) Patent No.: US 8,397,173 B2
(45) Date of Patent: Mar. 12, 2013

(54) METHODS AND APPARATUS USING A SERVICE TO LAUNCH AND/OR MONITOR DATA FORMATTING PROCESSES

(75) Inventors: Reid Hayhow, La Porte, CO (US); Carli Connally, Fort Collins, CO (US); Jerrold W. Akers, Loveland, CO (US)

(73) Assignee: Advantest (Singapore) Pte Ltd, Singapore (SG)

( * ) Notice: Subject to any disclaimer, the term of this patent is extended or adjusted under 35 U.S.C. 154(b) by 1835 days.

(21) Appl. No.: 11/345,049

(22) Filed: Jan. 31, 2006

(65) Prior Publication Data

US 2007/0208984 A1    Sep. 6, 2007

(51) Int. Cl.
*G06F 3/048* (2006.01)
*G06F 11/00* (2006.01)

(52) U.S. Cl. ............................ 715/771; 715/839; 714/48

(58) Field of Classification Search ................. 715/771, 715/970, 234, 760, 711, 839; 714/701, 742, 714/30, 33, 48; 707/7; 700/83, 95, 109; 703/17

See application file for complete search history.

(56) References Cited

U.S. PATENT DOCUMENTS

| | | | | |
|---|---|---|---|---|
| 4,639,881 | A * | 1/1987 | Zingher | 715/839 |
| 6,301,336 | B1 * | 10/2001 | Branton et al. | 379/29.01 |
| 6,493,841 | B1 * | 12/2002 | Kim et al. | 714/741 |
| 6,725,402 | B1 * | 4/2004 | Coss et al. | 714/48 |
| 7,146,539 | B2 * | 12/2006 | Hildebrant | 714/30 |
| 2006/0090139 | A1 * | 4/2006 | Jenni et al. | 715/760 |

OTHER PUBLICATIONS

Czapski, J., "Useful features of automated test systems in the R&D laboratory ," AUTOTESTCON Proceedings, 2000 IEEE, pp. 601-613, 2000.*

* cited by examiner

*Primary Examiner* — Robert Stevens
*Assistant Examiner* — Andrew Tank

(57) ABSTRACT

In one embodiment, a method of operating a number of data formatters 1) blocks execution of a tester's test processes that generate test results, the test results pertaining to test of at least one device under test (DUT); 2) launches a number of data formatters, operable to format the test results, while execution of the test processes is blocked; and 3) upon determining that the number of data formatters has successfully launched, removing the block. Other embodiments are also disclosed.

13 Claims, 3 Drawing Sheets

METHODS AND APPARATUS USING A SERVICE TO LAUNCH AND/OR MONITOR DATA FORMATTING PROCESSES

BACKGROUND

When testing a circuit, test results may be logged in a "raw" format. Often, this raw format is 1) not accepted by the application programs that are used to analyze the test results, and 2) difficult for test engineers and others persons to comprehend.

As a result of the above difficulties that a raw data format presents, raw data is often converted to one or more other formats by, for example, rearranging, sorting, grouping, distilling and/or performing other operations on the data.

SUMMARY OF THE INVENTION

In one embodiment, a method of operating a number of data formatters comprises 1) blocking execution of a tester's test processes that generate test results, the test results pertaining to test of at least one device under test (DUT); 2) launching a number of data formatters, operable to format the test results, while execution of the test processes is blocked; and 3) upon determining that the number of data formatters has successfully launched, removing the block.

In another embodiment, a computer-implemented service comprises 1) code to block execution of a tester's test processes that generate test results, the test results pertaining to test of at least one device under test (DUT); 2) code to launch a number of data formatters, operable to format the test results, while execution of the test processes is blocked; and 3) code to, upon determining that the number of data formatters has successfully launched, remove the block.

In yet another embodiment, apparatus comprises computer readable code stored on the computer readable media. The computer readable code comprises 1) code to launch at least one test process that generates test results pertaining to test of at least one device under test (DUT); 2) code to launch a number of data formatting processes, wherein each data formatting process is operable to format the test results; and 3) code to launch a service process. The service process is operable to monitor the formatting processes to detect the operational state of ones of the formatting processes, and then block the test processes when at least one of the formatting processes is not operational.

In still another embodiment, a method of monitoring a number of data formatters comprises 1) providing an interface for a user to select a number of data formatters to be monitored, the selected data formatters being operable to format test results produced by test processes of a tester; and 2) monitoring data formatters selected through the interface via a monitoring service, the monitoring service blocking execution of the test processes upon at least one of the selected data formatters failing to operate.

Other embodiments are also disclosed.

BRIEF DESCRIPTION OF THE DRAWINGS

Illustrative embodiments of the invention are illustrated in the drawings, in which.

DETAILED DESCRIPTION

Under ideal circumstances, a tester produces test results, and a number of data formatters receive and format the test results, and then output formatted test data. In some cases, the data formatters may receive the test results directly from the tester; and in other cases, the data formatters may receive or obtain the test results from a file or data store. However, data formatters may not be operational for a variety of reasons, such as, because a data formatter crashed; because an operator failed to start a data formatter before initiating test processes that generate test results; because a technician failed to configure a data formatter to be started upon the start of a tester's test processes; or because an operator paused a data formatter and failed to restart it.

The consequences that flow from generating test results without a data formatter being operative can be significant. Namely, if test results are to be formatted more or less in parallel with their generation, the failure to start or restart a data formatter can result in a need to generate and format test results via serially-executed processes (which can increase the amount of time needed to obtain useful, formatted test results by hours, days or weeks). Even more significantly, failure to start or restart a data formatter can sometimes lead to data loss (i.e., when test results are stored in-memory, or in another temporary data store, and then deleted before the data formatter is started).

Running a data formatter monitoring service (hereafter referred to as a "service") ensures that a tester is not inadvertently operated without one or more data formatters being operational. The service may monitor the data formatters, and then block the tester from launching or continuing to execute test processes (e.g., those processes that produce test results). Once the test processes are blocked, an exception may be made to allow a user to override the block; but, without a deliberate act in response to the block, the block remains and the tester is prevented from executing its test processes.

Figure 1:
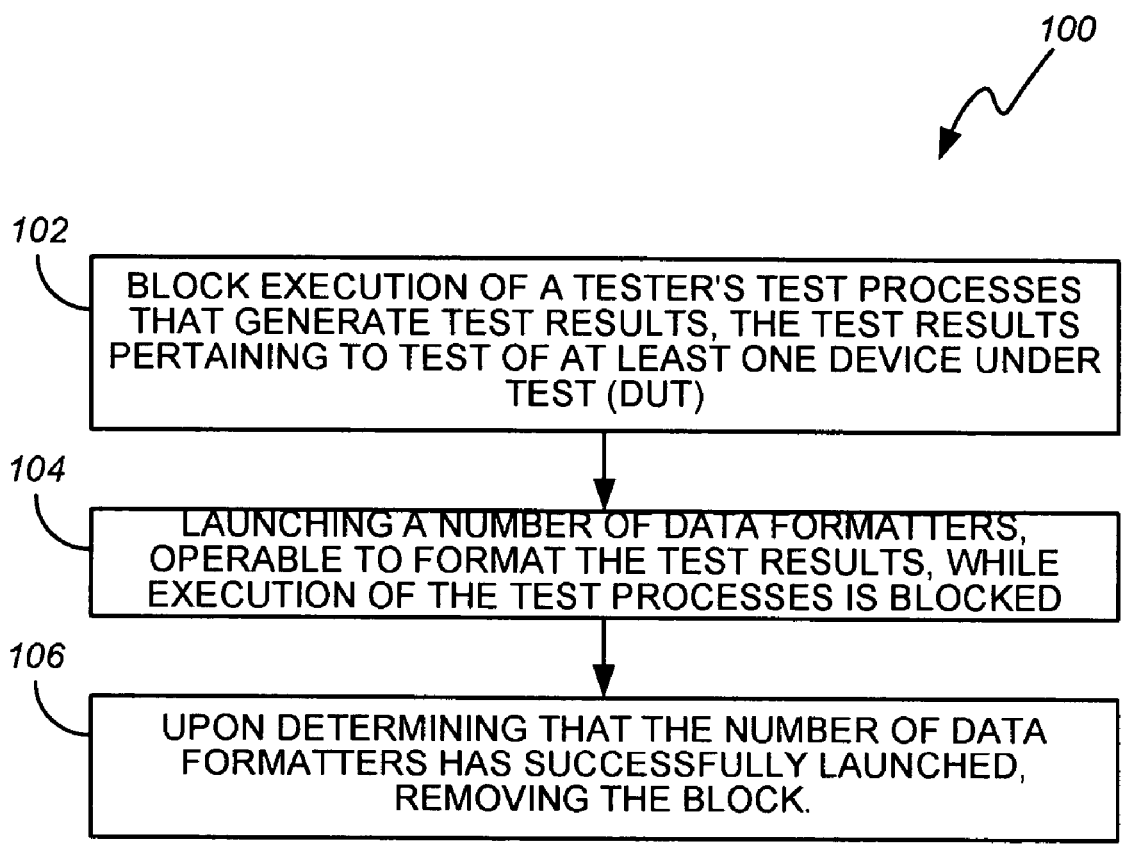
FIG. 1 illustrates an exemplary method for blocking test processes until a number of data formatters are successfully launched.

FIG. 1 illustrates an exemplary method 100 for blocking test processes until a number of data formatters have successfully launched. The method 100 comprises blocking execution of a tester's test processes that generate test results (where the test results pertain to test of at least one device under test (DUT) (see block 102). A number of data formatters, operable to format the test results, is then launched while the test process are blocked (block 104). Then, upon determining that the number of data formatters has successfully launched, the block is removed (block 106). Preferably, the blocking, launching and determining actions of the method 100 are initiated upon start of the tester, and before launch of the tester's test processes. In some cases, this may be done by launching the data formatters as services (e.g., as preliminary or background processes that support the test processes).

In one embodiment, blocking execution of the test processes entails blocking execution of all test processes of the tester. In another embodiment, the blocking only entails blocking the processes of the tester that generate test results. Denying permission for the test processes to execute is variously embodied, and may include resource starving, thread suspension, or signaling the test processes to suspend (wherein the test processes respond to the signal by self-suspending).

In one embodiment of the method, each of the data formatters sends a message to indicate that it has launched successfully. In another embodiment, each data formatter sets a memory value (e.g., a semaphore, flag or array element) to indicate that it has successfully launched. In yet another embodiment, each of the data formatters is queried to determine that it has successfully launched.

Optionally, the method 100 may comprise reading configuration data to identify the number of data formatters to launch. The configuration data may be read from a file, memory, user input, or other input source. Alternately, the configuration data may be obtained by querying ones of the data formatters, or by querying a configuration data source associated with ones of the data formatters.

The method 100 may also comprise alerting a user that the execution of test processes has been blocked. For purposes of this description, the "user" may be a human operator or a process programmed to respond to such an alert.

Upon determining that the number of data formatters has not successfully launched, a user may be prompted to override a block, and upon receiving the user's override, the method 100 may remove the block. A user may be notified via a prompt on a terminal, or through other communication means. Additionally, authorization and/or security screening may be employed to ensure that only authorized users are allowed to override a block.

During execution of a tester's test processes, the number of data formatters may be monitored. Then, and upon determining that at least one of the number of data formatters is no longer operational, execution of the tester's test processes may once again be blocked. A data formatter may cease to be operational for many reasons, including, for example, because of a deliberate action on behalf of a user, or because of a crash.

A data formatter's lack of operation may be detected as a result of various conditions, including, for example, the data formatter failing to send a "heartbeat" signal; the data formatter consuming near zero resources; the data formatter consuming all resources available to the data formatter (e.g., a race condition or an endless loop); the data formatter failing to produce formatted test data for a period of time; or other means indicative of the health of a formatting process.

Preferably, the method 100 attempts to restart any data formatter that is no longer operational. Alternately, an alerted user may attempt to restart a data formatter that is no longer operational. Then, upon determining that the number of data formatters is once again operational, the method 100 may remove its block of the test processes.

The method 100 shown in FIG. 1 may be implemented by means of computer readable code stored on computer readable media. The computer-readable media may include, for example, any number or mixture of fixed or removable media (such as one or more fixed disks, random access memories (RAMs), read-only memories (ROMs), or compact discs), at either a single location or distributed over a network. The computer readable code will typically comprise software, but could also comprise firmware or a programmed circuit.

Figure 2:
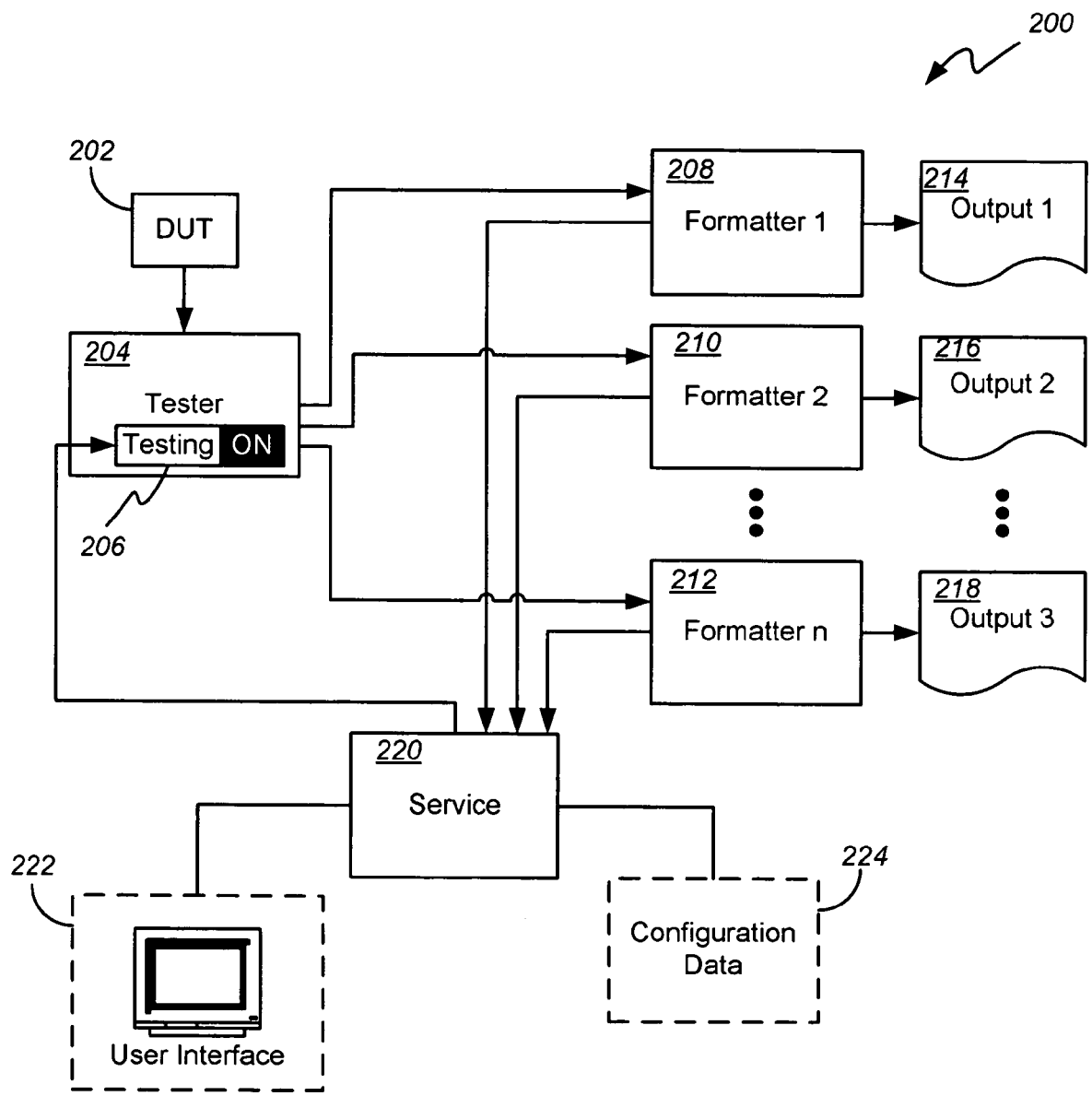
FIG. 2 illustrates a block diagram of an exemplary system for monitoring a number of data formatting processes and selectively blocking test processes.

FIG. 2 illustrates a block diagram of an exemplary system 200 for monitoring a number of data formatters 208, 210, 212 and selectively blocking test processes. The tester 204 is configured to perform tests on one or more DUTs 202 and produce test results for the data formatters 208, 210, 212. The data formatters 208, 210, 212 then receive the test results (either directly, from the tester 204, or indirectly, from a file or the like), format the test results, and output formatted data (i.e., as Output_1, Output_2 and Output_3). By way of example, the data formatters 208, 210, 212 may take various forms, including forms such as an ASCII (American Standard Code for Information Interchange) formatter, an XML (extensible Markup Language) formatter, an EDL formatter and/or an STDF (Standard Test Definition Format) formatter. Also, the formatters' outputs 214, 216, 218 may be variously embodied, and may include files, databases, display formats, or other output formats or structures.

A service 220 monitors the data formatters 208, 210, 212 and, upon determining that at least one of data formatters 208, 210, 212 is not operational, blocks the tester 204 from executing test processes that produce test results. A blocking state is conceptually depicted by a testing flag 206 that may be set to "ON" (blocking on) or "OFF" (blocking off). The actual means to block the test processes is a matter of design choice, and may include suspending threads of the tester that execute the test processes, suspending the tester in its entirety, denying processing resources to test processes, signaling the test processes to suspend, and other means of processes blocking that are known or will be developed.

Optionally, the service 220 reads configuration data 224 to identify which data formatters 208, 210, 212 to service. The configuration data 224 may also specify alerting processes that are to be executed upon blocking the test processes of the tester 204. These alerting processes may variously comprise, for example, displaying a message on a display, or triggering a visual or audible alert for an operator.

In one embodiment of the system 200, an interface 222, such as a graphical user interface (GUI) may be used to receive any or all of: a user's selection of which data formatters the service 220 should monitor; a user's override of a block; or a user's selection of alerting methods via which the user can be alerted that test processes have been blocked.

Figure 3:
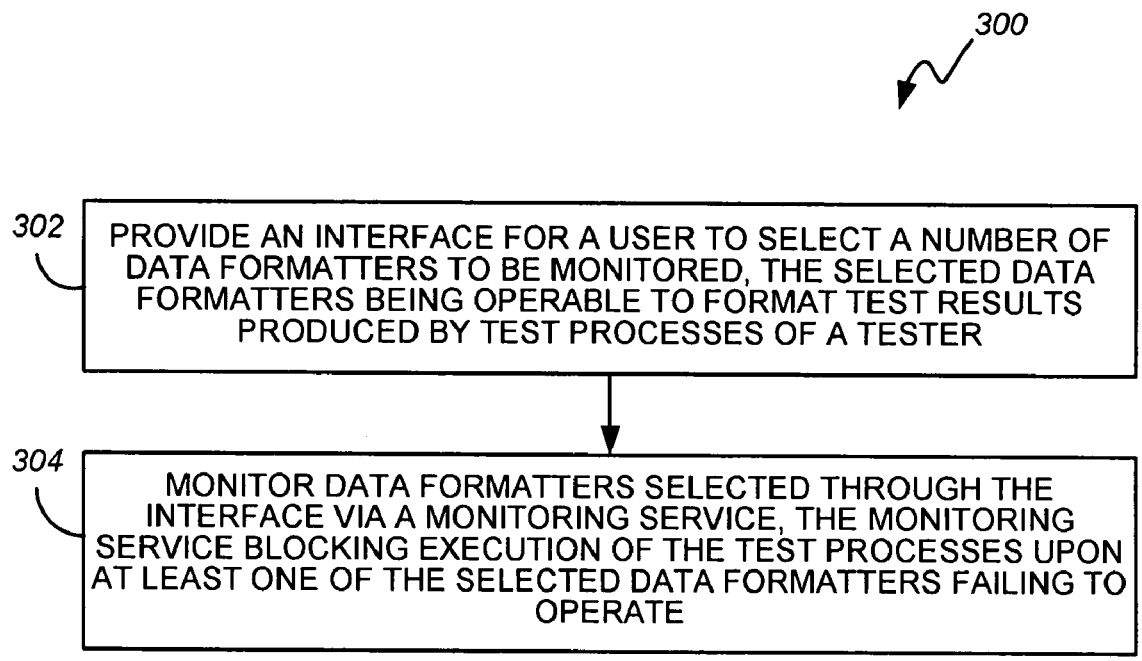
FIG. 3 illustrates an exemplary method of monitoring a number of data formatters.

FIG. 3 illustrates an exemplary method 300 for monitoring a number of data formatters. The method 300 comprises 1) providing an interface for a user to select a number of data formatters to be monitored, the selected data formatters being operable to format test results produced by test processes of a tester (see block 302); and 2) monitoring the data formatters that are selected through the interface via a monitoring service (block 304). As previously described, the monitoring service blocks execution of the test processes when one of the selected data formatters fails to operate.

Optionally, the method 300 may further comprise 1) providing an interface for a user to select an alerting method via which the user can be alerted that the test processes are blocked; and 2) when execution of the test processes is blocked, using the selected alerting method to alert the user that the execution of the test processes has been blocked.

In one embodiment, the selections made through the interface employed by the method 300 are saved in a configuration file.

The methods 100, 300 and apparatus 200 disclosed above can be used in many applications, one being the storing and formatting of test results such as circuit test results. In one particular application, the test results may be generated by a 93000 SOC Series tester offered by Agilent Technologies, Inc. The 93000 SOC Series tester is an SOC (System On a Chip) tester.

What is claimed is:

1. A method of operating a number of data formatters, comprising:

running a data formatter monitoring service, the data formatter monitoring service, determining when any of the number of data formatters is not operational and then blocking execution of a tester's test processes that generate test results formatted by the number of data formatters, the test results pertaining to test of at least one device under test (DUT);

attempting to launch or restart any of the number of data formatters that is not operational, while execution of the test processes is blocked; and upon determining that the number of data formatters has successfully launched or restarted, removing the block.

2. The method of claim 1, wherein the data formatter monitoring service is run upon start of the tester, and before launch of said test processes.

3. The method of claim 1, further comprising, reading configuration data to identify the number of data formatters to launch.

4. The method of claim 1, further comprising, alerting a user that the execution of the test processes has been blocked.

5. The method of claim 1, further comprising:

upon determining that the number of data formatters has not successfully launched, prompting a user to override the block; and upon receiving the user's override, removing the block.

6. The method of claim 1, further comprising:

during execution of the test processes, monitoring the number of data formatters; and upon determining that at least one of the number of data formatters is no longer operational, blocking execution of the test processes.

7. Apparatus, comprising:

non-transitory computer readable media; and computer readable code, stored on the non-transitory computer readable media, including, code to launch a data formatter monitoring service, the data formatter monitoring service, determining when any of a number of data formatters is not operational and then blocking execution of a tester's test processes that generate test results formatted by the number of data formatters, the test results pertaining to test of at least one device under test (DUT);

attempting to launch or restart any of the number of data formatters that is not operational, while execution of the test processes is blocked; and upon determining that the number of data formatters has successfully launched or restarted, removing the block.

8. The apparatus of claim 7, wherein said code launches the data formatter monitoring service upon start of the tester, and before launch of said test processes.

9. The apparatus of claim 7, further comprising, code to read configuration data to identify the number of data formatters to launch.

10. The apparatus of claim 7, further comprising, code to alert a user that the execution of the test processes has been blocked.

11. The apparatus of claim 7, further comprising:

code to, upon determining that the number of data formatters has not successfully launched, prompt a user to override the block; and code to, upon receiving the user's override, remove the block.

12. The apparatus of claim 7, further comprising:

code to, during execution of the test processes, monitor the number of data formatters; and code to, upon determining that at least one of the number of data formatters is no longer operational, block execution of the test processes.

13. Apparatus, comprising:

non-transitory computer readable media; and computer readable code, stored on the non-transitory computer readable media, including, code to launch at least one test process that generates test results pertaining to test of at least one device under test (DUT);

code to launch a number of data formatting processes, wherein each data formatting process is operable to format the test results;

code to launch a service process, operable to, monitor the data formatting processes to detect the operational state of ones of the formatting processes;

block the test processes when any of the formatting processes is not operational;

attempt to launch or restart any of the number of data formatters that is not operational, while execution of the test processes is blocked; and remove the block upon determining that the number of data formatters has successfully launched or restarted.

* * * * *